(12) United States Patent
Wang et al.

(10) Patent No.: US 8,143,590 B2
(45) Date of Patent: Mar. 27, 2012

(54) ION SOURCE APPARATUS

(76) Inventors: Tsai-Cheng Wang, Wuqi Township, Taichung County (TW); Chin-Chung Yang, Wuqi Township, Taichung County (TW); An-Ting Hsiao, Wuqi Township, Taichung County (TW); Yu-Li Tsai, Wuqi Township, Taichung County (TW)

( * ) Notice: Subject to any disclaimer, the term of this patent is extended or adjusted under 35 U.S.C. 154(b) by 109 days.

(21) Appl. No.: 12/838,309

(22) Filed: Jul. 16, 2010

(65) Prior Publication Data

US 2012/0012755 A1    Jan. 19, 2012

(51) Int. Cl.
*H01J 49/10* (2006.01)
*H01J 37/08* (2006.01)
*H01J 7/24* (2006.01)

(52) U.S. Cl. ............... 250/423 R; 250/426; 315/111.81; 315/111.91; 313/362.1

(58) Field of Classification Search .............. 250/423 R, 250/426; 315/111.81, 111.91; 313/362.1
See application file for complete search history.

(56) References Cited

U.S. PATENT DOCUMENTS

| | | | | |
|---|---|---|---|---|
| 7,425,711 B2 * | 9/2008 | Burtner et al. | ................ | 250/426 |
| 7,476,869 B2 * | 1/2009 | Burtner et al. | ............. | 250/423 R |
| 7,566,883 B2 * | 7/2009 | Burtner et al. | ............. | 250/423 R |
| 7,609,003 B2 * | 10/2009 | Horsky et al. | ............ | 315/111.81 |

* cited by examiner

*Primary Examiner* — Nikita Wells
(74) *Attorney, Agent, or Firm* — patenttm.us

(57) ABSTRACT

An ion source apparatus has an ion source assembly and a neutralizer. The ion source assembly has a body, a heat-dissipating device, an anode chunk and a gas distributor. The heat-dissipating device has a thermal transfer plate and a first thermal side sheet. The thermal transfer plate has a top, a protrusion and an annular disrupting recess. The protrusion is formed at the top of the thermal transfer plate. The disrupting recess is radially formed around the protrusion. The first thermal side sheet surrounds the protrusion. The gas distributor is mounted securely in the protrusion. Because the protrusion is located between the gas distributor and the first thermal side sheet and the disrupting recess is radially formed around the protrusion, accumulated ions, molecules and deposition film particles are longitudinally disrupted and do not form a short circuit between the gas distributor and the first thermal side sheet.

10 Claims, 6 Drawing Sheets

ION SOURCE APPARATUS

BACKGROUND OF THE INVENTION

1. Field of the Invention

The present invention relates to an ion source apparatus, and more particularly to an ion source apparatus which disrupts accumulated ions, molecules and deposition film particles.

2. Description of Related Art

A conventional ion source apparatus is widely used in an ion plating technology which is applied to products of optoelectronics, such as a cold-mirror watch system, an image IR-cut, a reticle mask, an UV-IR-CUT, a R.G.B-AR and filters or the like. The conventional ion source apparatus has an ion source assembly and a neutralizer. The ion source assembly has a thermal side sheet, a gas distributor and is capable of allowing gas with ions to jet upwards to a substrate. The gas distributor is metallic. The neutralizer is capable of emitting electrons. The electrons will combine with the ions jetted out from the ion source assembly to form multiple kinetic molecules moving upwards. The kinetic molecules jet toward the substrate to intensify adhesion and density of a deposition film formed on the substrate.

However, the ions jetted out from the ion source assembly and the molecules will fall down and particles of the deposition film will peel off after the ion source assembly being shut down. Accordingly, falling the ions and molecules and peeling deposition film particles accumulate between the thermal side sheet and the gas distributor to cause a short circuit. Consequently, to frequently disassemble and clean the conventional ion source apparatus is necessary and is inconvenient for users.

To overcome the shortcomings, the present invention tends to provide an ion source apparatus to mitigate the aforementioned problems.

SUMMARY OF THE INVENTION

The main objective of the invention is to provide an ion source apparatus which disrupts accumulated ions, molecules and deposition film particles.

An ion source apparatus has an ion source assembly and a neutralizer. The ion source assembly has a body, a heat-dissipating device, an anode chunk and a gas distributor. The heat-dissipating device has a thermal transfer plate and a first thermal side sheet. The thermal transfer plate has a top, a protrusion and a disrupting recess. The protrusion is formed at the top of the thermal transfer plate. The disrupting recess is radially formed around the protrusion. The first thermal side sheet surrounds the protrusion. The gas distributor is axially mounted securely in the protrusion. Because the protrusion is located between the gas distributor and the first thermal side sheet and the disrupting recess is radially formed around the protrusion, accumulated ions, molecules and deposition film particles are longitudinally disrupted and do not form a short circuit between the gas distributor and the first thermal side sheet. Other objects, advantages and novel features of the invention will become more apparent from the following detailed description when taken in conjunction with the accompanying drawings.

DETAILED DESCRIPTION OF PREFERRED EMBODIMENT

Figure 1:
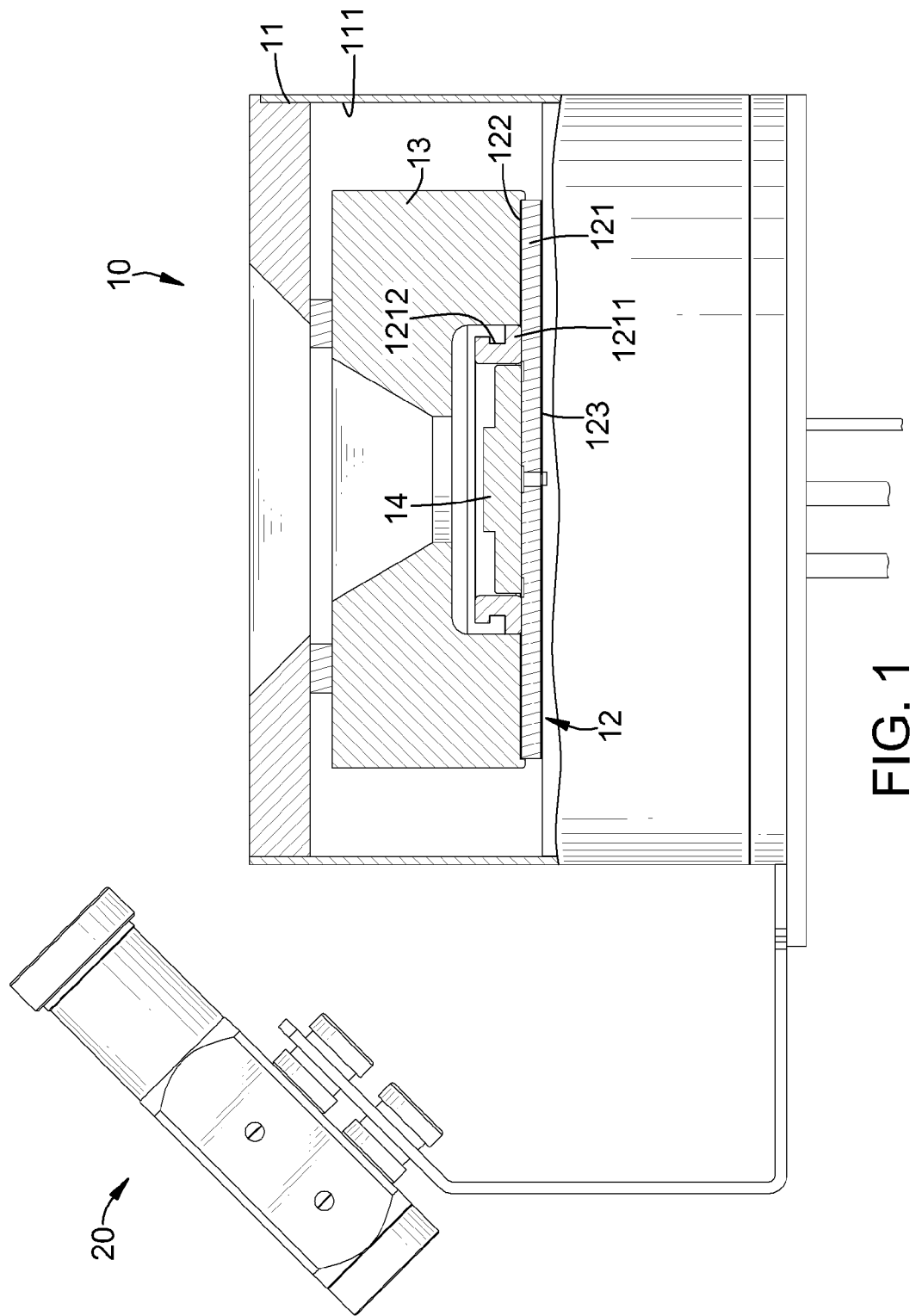
FIG. 1 is a side view in partial section of a first embodiment of an ion source apparatus in accordance with the present invention.
Figure 2:
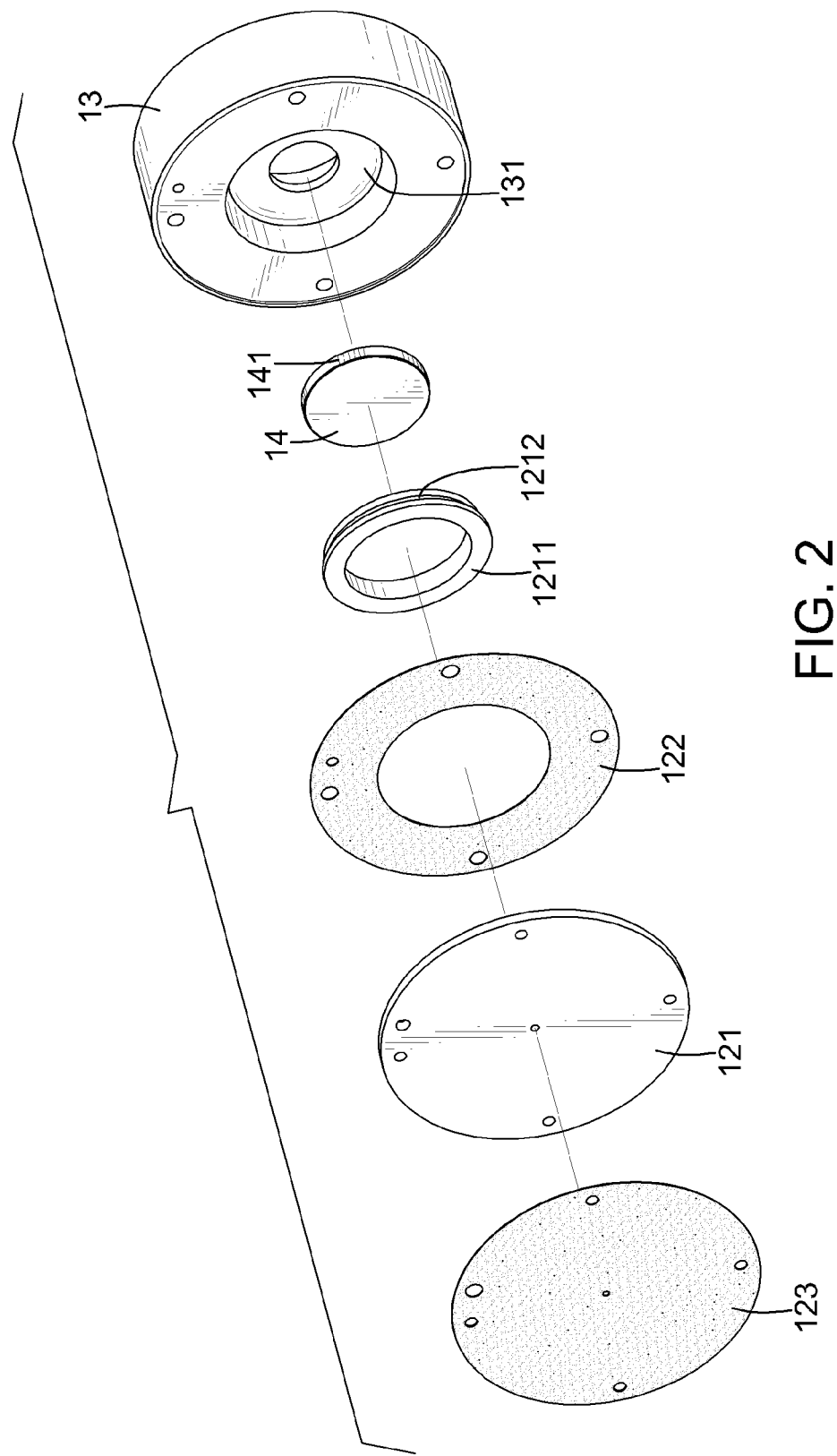
FIG. 2 is an exploded perspective view of the ion source apparatus in FIG. 1.
Figure 3:
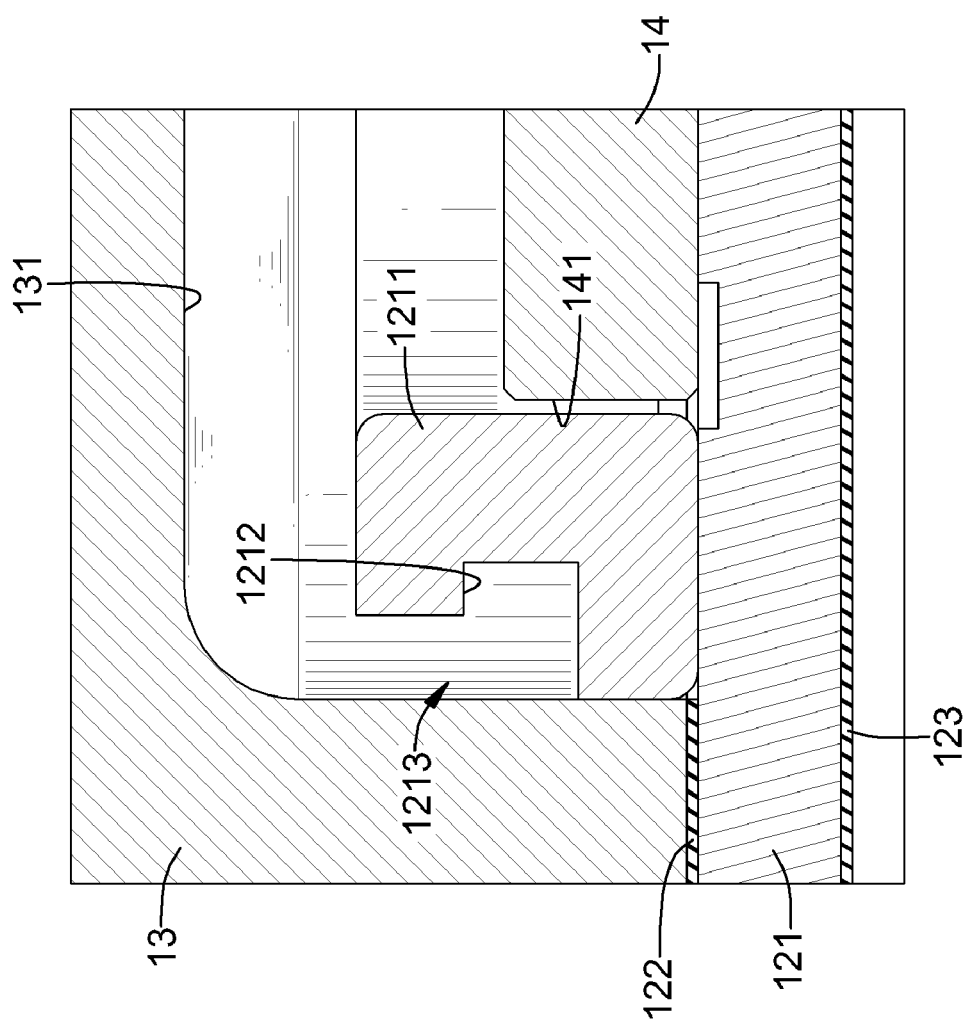
FIG. 3 is an enlarged cross sectional side view of the ion source apparatus in FIG. 1.

With reference to FIGS. 1 to 3, a first embodiment of an ion source apparatus in accordance with the present invention comprises an ion source assembly 10 and a neutralizer 20.

The ion source assembly 10 has a body 11, a heat-dissipating device 12, an anode chunk 13 and a gas distributor 14. The body 11 is substantially cylindrical and has a top and a chamber 111. The chamber 111 is formed in the top of the body 11 and has a bottom and an upward opening allowing gas with ions to jet out.

The heat-dissipating device 12 is mounted securely on the bottom of the chamber 111 and has a thermal transfer plate 121, a first thermal side sheet 122 and a second thermal side sheet 123.

The thermal transfer plate 121 is a ceramic round plate and has an axis, a top, a bottom, a protrusion 1211 and a disrupting recess 1212. The top of the thermal transfer plate 121 is opposite to the bottom of the chamber 111. The protrusion 1211 surrounds the axis of the thermal transfer plate 121 and is mounted at the top of the thermal transfer plate 121. The disrupting recess 1212 is radially formed around the protrusion 1211. The first thermal side sheet 122 is an annular graphite sheet, is mounted securely on the top of the thermal transfer plate 121 and surrounds the protrusion 1211. The second thermal side sheet 123 is a round graphite sheet and is mounted securely on the bottom of the thermal transfer plate 121. The first thermal side sheet 122 and the second thermal side sheet 123 are used to dissipate heat of the thermal transfer plate 121.

The heat-dissipating device 12 except the protrusion 1211 may be conventional and detailed description is omitted. A theory and process of how gas moves up to bring ions is also omitted.

Preferably, the protrusion 1211 is annular and has a top surface and an outer surface. The disrupting recess 1212 is annular and is radially formed around the outer surface of the protrusion 1211. The thermal transfer plate 121 further has a plate groove 1213, 1213A, 1213B. The plate groove 1213, 1213A, 1213B is annular, is radially formed around the outer surface of the protrusion 1211 beside the disrupting recess 1212, is formed through the top surface of the protrusion 1211 and communicates with the disrupting recess 1212.

Preferably, the thermal transfer plate 121 has a base plate. The base plate has a top surface. The protrusion 1211, 1211A, 1211B is securely mounted on the top surface of the base plate.

The anode chunk 13 is round and hollow, is mounted securely in the chamber 111, is mounted above and abuts the first thermal side sheet 122 and has a bottom and a round chunk cavity 131. The chunk cavity 131 is formed in the bottom of the anode chunk 13 and encompasses the protrusion 1211. Preferably, the chunk cavity 131 has an inner surface and the protrusion 1211 abuts tightly the inner surface of the chunk cavity 131.

The gas distributor 14 is a round metallic plate, is axially mounted securely in the protrusion 1211 and abuts the top of the thermal transfer plate 121. Preferably, the protrusion 1211 has an inner surface and the gas distributor 14 tightly abuts the inner surface of the protrusion 1211.

The gas distributor 14 has an outer surface, a bottom and multiple gas grooves 141. The multiple gas grooves 141 are longitudinally formed at intervals in the outer surface of the gas distributor 14. Though the gas distributor 14 tightly abuts the inner surface of the protrusion 1211, the gas grooves 141 allow gas to flow upwardly from the bottom of the gas distributor 14 to the chunk cavity 131.

With reference to FIG. 1, the neutralizer 20 is mounted outside and securely connected with the ion source assembly 10 and is capable of emitting electrons. The electrons will combine with the ions jetted out from the ion source assembly 10 to form multiple kinetic molecules moving upwards. The neutralizer 20 may be conventional and detailed description is omitted.

Figure 4:
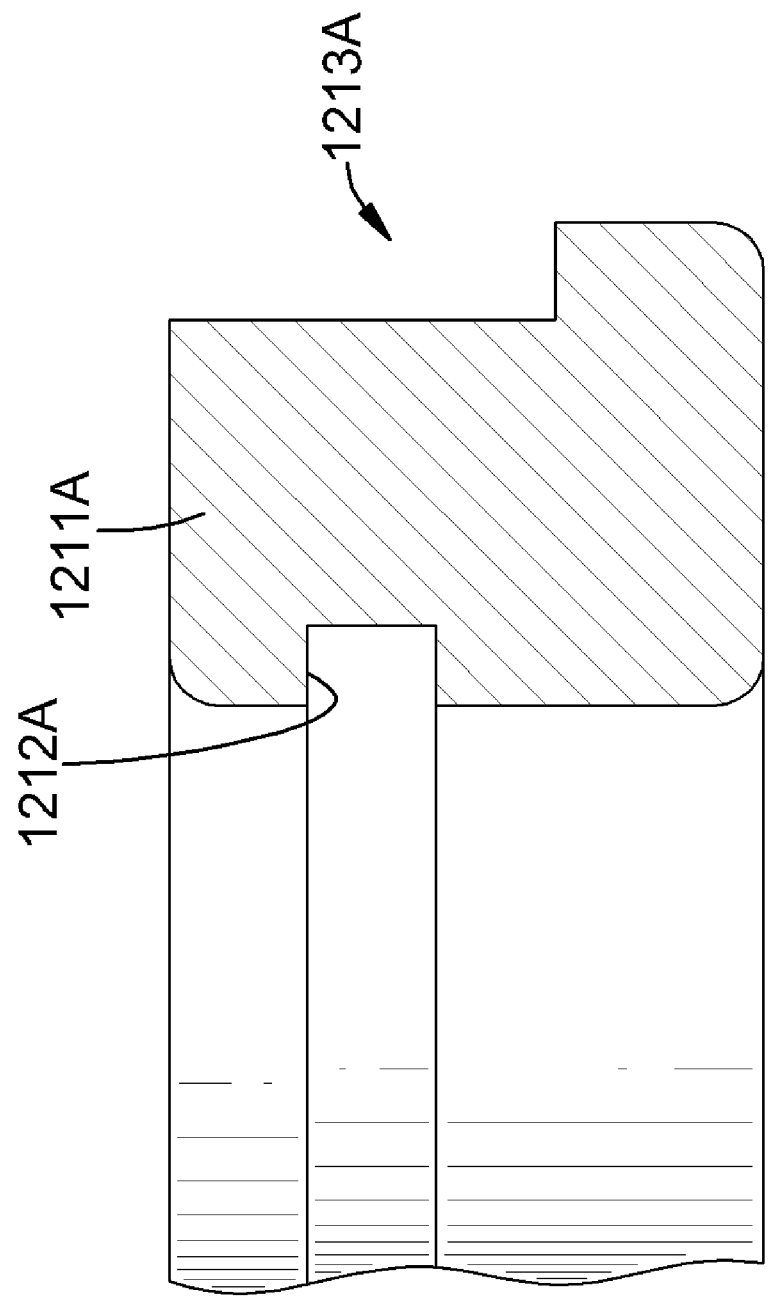
FIG. 4 is an enlarged cross sectional side view of a second embodiment of the ion source apparatus in accordance with the present invention, wherein a protrusion is shown.

With further reference to FIG. 4, a second embodiment of the ion source apparatus is substantially the same as the first embodiment of the ion source apparatus in accordance with the present invention. The disrupting recess 1212A is annular and is radially formed around the inner surface of the protrusion 1211A.

Figure 5:
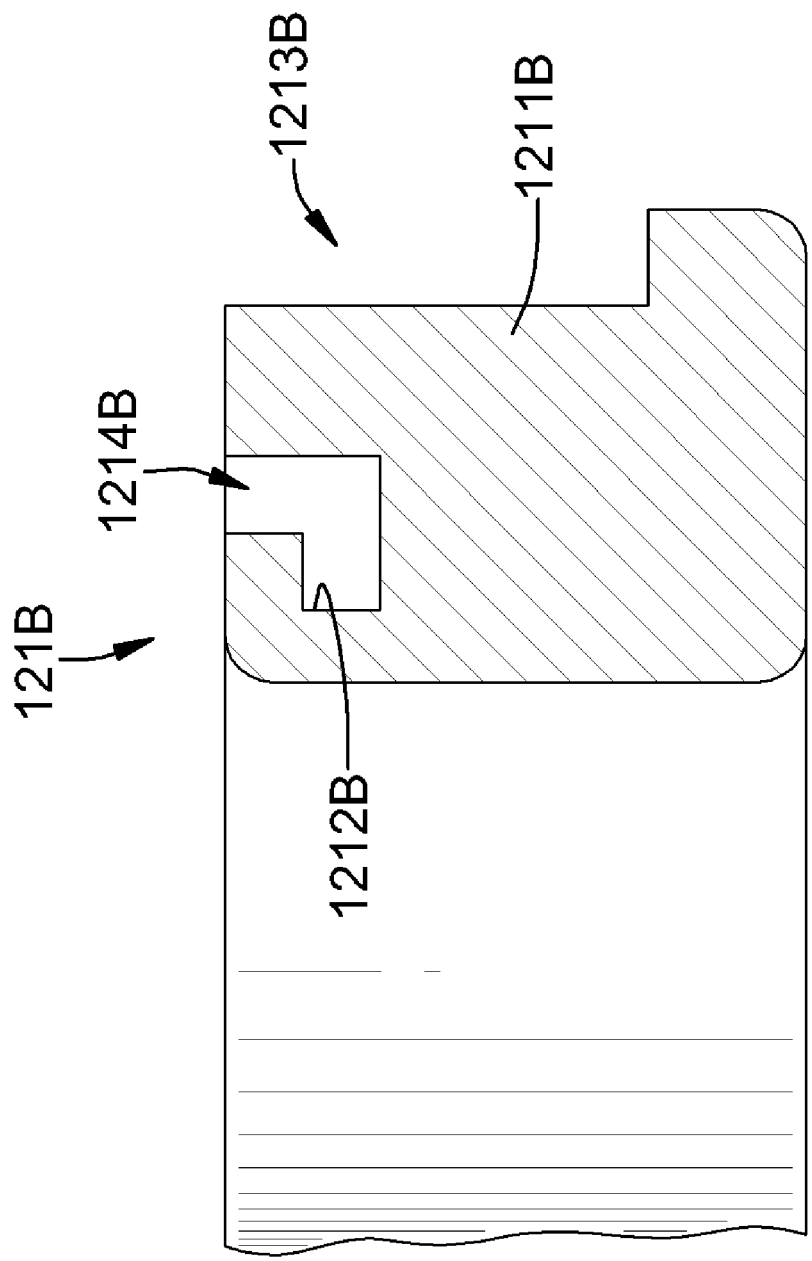
FIG. 5 is an enlarged cross sectional side view of a third embodiment of the ion source apparatus in accordance with the present invention, wherein a protrusion is shown.

With reference to FIG. 5, a third embodiment of the ion source apparatus is substantially the same as the first embodiment of the ion source apparatus in accordance with the present invention. The thermal transfer plate 121B has a plate recess 1214B. The plate recess 1214B is annular and is formed around the top surface of the protrusion 1211B beside the plate groove 1213B and has two side surfaces facing each other. The disrupting recess 1212B is annular and is radially formed around one of the side surfaces of the plate recess 1214B.

Figure 6:
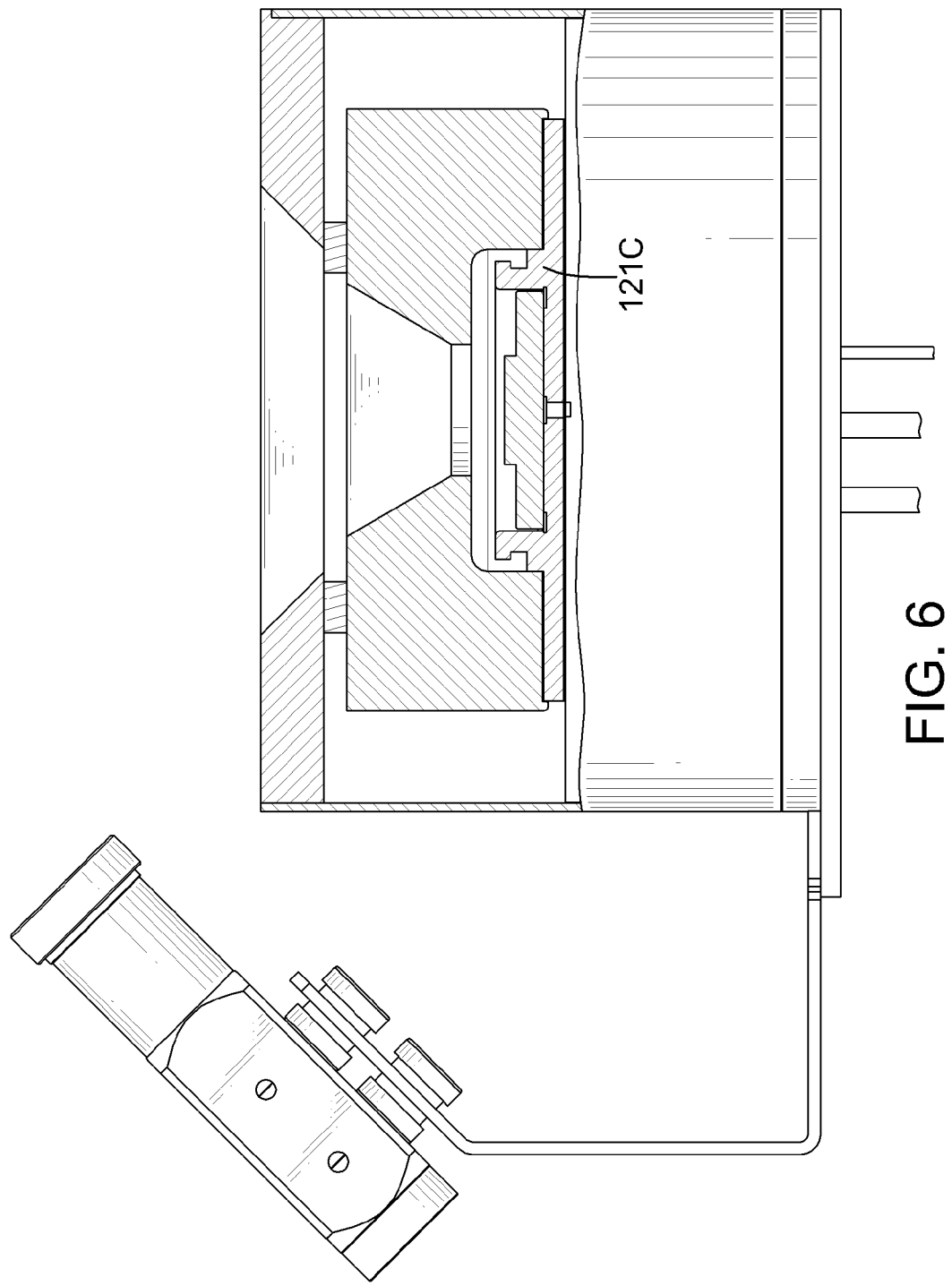
FIG. 6 is a side view in partial section of a fourth embodiment of the ion source apparatus in accordance with the present invention.

With reference to FIG. 6, a fourth embodiment of the ion source apparatus is substantially the same as the first embodiment of the ion source apparatus in accordance with the present invention. The base plate is integrally connected with the protrusion as a single part to form the thermal transfer plate 121C of the fourth embodiment.

The protrusion 1211,1211A,1211B and the disrupting recess 1212,1212A,1212B may be square or elliptical or other shape. The present invention does not limit shapes of the protrusion 1211,1211A,1211B and the disrupting recess 1212,1212A,1212B.

From the above description, it is noted that the present invention has the following advantages:

1. Disrupting the accumulated ions, molecules and deposition film particles:

Because the protrusion 1211,1211A,1211B is located between the gas distributor 14 and the first thermal side sheet 122 and the disrupting recess 1212, 1212A,1212B is radially formed around the protrusion 1211,1211A,1211B, the accumulated ions, molecules and deposition film particles are longitudinally disrupted and divided into two parts by the disrupting recess 1212, 1212A,1212B. Accordingly, the gas distributor 14 will not form a short circuit with the first thermal side sheet 122. To frequently disassemble and clean the ion source apparatus is unnecessary, so the ion source apparatus is endurable and convenient in use.

2. Simple structure:

To add the protrusion 1211,1211A,1211B and the disrupting recess 1212, 1212A,1212B is simple and convenient.

Moreover, the protrusion 1211,1211A,1211B abuts tightly the inner surface of the chunk cavity 131 and the gas distributor 14 tightly abuts the inner surface of the protrusion 1211, 1211A,1211B, so an extra bolt mounted securely though the gas distributor 14 to secure the gas distributor 14 is not needed. Consequently, a cost of manufacturing the bolt is saved.

Even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. An ion source apparatus comprising:
    an ion source assembly having
        a body having
            a top; and
            a chamber formed in the top of the body and having a bottom and an upward opening;
        a heat-dissipating device mounted securely on the bottom of the chamber and having
            a thermal transfer plate having
                an axis;
                a top opposite to the bottom of the chamber
                a protrusion surrounding the axis of the thermal transfer plate and mounted at the top of the thermal transfer plate and
                a disrupting recess radially formed around the protrusion; and
            a first thermal side sheet mounted securely on the top of the thermal transfer plate and surrounding the protrusion;
        an anode chunk mounted securely in the chamber, mounted above and abutting the first thermal side sheet and having
            a bottom; and
            a chunk cavity formed in the bottom of the anode chunk and encompassing the protrusion; and
        a gas distributor mounted securely in the protrusion and abutting the top of the thermal transfer plate and
    a neutralizer mounted outside and securely connected with the ion source assembly.

2. The ion source apparatus as claimed in claim 1, wherein the protrusion is annular and has an outer surface; and the disrupting recess is annular and is radially formed around the outer surface of the protrusion.

3. The ion source apparatus as claimed in claim 1, wherein the protrusion is annular and has an inner surface; and the disrupting recess is annular and is radially formed around the inner surface of the protrusion.

4. The ion source apparatus as claimed in claim 1, wherein the protrusion is annular and has a top surface; the thermal transfer plate has an annular plate recess formed around the top surface of the protrusion and having two side surfaces facing each other; and the disrupting recess is annular and is radially formed around one of the side surfaces of the plate recess.

5. The ion source apparatus as claimed in claim 1, wherein the thermal transfer plate has a base plate; and the base plate has a top surface and the protrusion is securely mounted on the top surface of the base plate.

6. The ion source apparatus as claimed in claim 2, wherein the thermal transfer plate has a base plate; and the base plate has a top surface and the protrusion is securely mounted on the top surface of the base plate.

7. The ion source apparatus as claimed in claim 3, wherein the thermal transfer plate has a base plate; and the base plate has a top surface and the protrusion is securely mounted on the top surface of the base plate.

8. The ion source apparatus as claimed in claim 4, wherein the thermal transfer plate has a base plate; and the base plate has a top surface and the protrusion is securely mounted on the top surface of the base plate.

9. The ion source apparatus as claimed in claim 6, wherein the base plate is integrally connected with the protrusion as a single part to form the thermal transfer plate.

10. The ion source apparatus as claimed in claim 6, wherein the protrusion has
- an inner surface which the gas distributor tightly abuts; and
- a top surface;

the thermal transfer plate has an annular plate groove radially formed around the outer surface of the protrusion beside the disrupting recess, formed through the top surface of the protrusion and communicating with the disrupting recess;

the chunk cavity has an inner surface which the protrusion tightly abuts; and the gas distributor has an outer surface and multiple gas grooves longitudinally formed at intervals in the outer surface of the gas distributor.

* * * * *